United States Patent [19]
Yojima et al.

[11] Patent Number: 6,133,744
[45] Date of Patent: *Oct. 17, 2000

[54] APPARATUS FOR TESTING SEMICONDUCTOR WAFER

[75] Inventors: Masayuki Yojima; Tohru Tsujide; Kazuo Nakaizumi, all of Tokyo, Japan

[73] Assignee: NEC Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/637,603

[22] Filed: Apr. 25, 1996

[30] Foreign Application Priority Data

Apr. 28, 1995 [JP] Japan .................................. 7-129772
Jun. 23, 1995 [JP] Japan .................................. 7-157295

[51] Int. Cl.[7] .......................... G01R 1/073; G01R 31/28
[52] U.S. Cl. .......................................... 324/754; 324/765
[58] Field of Search ................................ 324/754, 758, 324/762, 765, 757

[56] References Cited

U.S. PATENT DOCUMENTS 5,070,297  12/1991  Kwon et al. ............................ 324/754
5,408,190   4/1995  Wood et al. ........................... 324/765
5,574,382  11/1996  Kimura .................................. 324/754
5,701,666  12/1997  DeHaven ............................... 324/754

FOREIGN PATENT DOCUMENTS 2-239641  9/1990  Japan .

OTHER PUBLICATIONS

M. Sugimoto et al., "Ultra High Density Anisotropic Conductive Film", *Nitto Technical Report,* vol. 30, No. 1, May 1992, pp. 45–47.

*Primary Examiner*—Ernest Karlsen
*Attorney, Agent, or Firm*—Sughrue, Mion, Zinn, Macpeak & Seas, PLLC

[57] ABSTRACT

The present invention provides a semiconductor wafer tester including a substrate, at least one chip mounted on an upper surface of the substrate, the chip having function as a tester, the chip being electrically connected to a contact formed on a lower surface of the substrate through an internal wiring formed in the substrate, and a contact film having at least one first bump formed on an upper surface thereof and at least one second bump formed on a lower surface thereof, the first bump being electrically connected to the second bump through an internal wiring formed throughout the contact film, the contact film being to be disposed to be sandwiched between the substrate and a semiconductor wafer to be tested so that the first bump is in electrical contact with the contact of the substrate and the second bump is in electrical contact with the semiconductor wafer. The tester makes it possible to carry out high frequency test concurrently for a plurality of semiconductor wafers in a shorter period of time with lower costs.

9 Claims, 7 Drawing Sheets

APPARATUS FOR TESTING SEMICONDUCTOR WAFER

BACKGROUND OF THE INVENTION

1. Field of the Invention

The invention relates to an apparatus for testing a semiconductor wafer, and also to a contact film to be used for such an apparatus.

2. Description of the Related Art

Hereinbelow will be explained a method of testing a DRAM semiconductor wafer by using a memory tester as an example of a conventional test for a semiconductor wafer with reference to FIG. 1 illustrating a conventional tester including a wafer prober.

A tester includes a wafer prober 10 having a generally U-shaped frame 11. On a lower inner surface of the U-shaped frame 11 is placed an X-Y stage 12 capable of moving in two directions perpendicular to each other. On the X-Y stage 12 is placed a vacuum chuck 13 for fixing a wafer 14 to be tested thereon in place. To an upper inner surface of the U-shaped frame 11 is secured a probe card 15 from which probes 16 extend vertically downwardly. The probes 16 are to make electrical contact with contact pads formed on an upper surface of the wafer 14 to be tested. The tester further includes a memory tester 17 which is in electrical connection with the wafer prober 10 through a cable 18.

The memory tester 17 provides electrical power and signals required for carrying out a test to the wafer 14 to be tested through the cable 18 and the probe card 15, whereas the wafer 14 transmits output signals to the memory tester 17 through the probe card 15 and the cable 18. The memory tester 17 analyzes the thus received output signals, and judges as to whether the wafer 14 operates properly or not.

However, the probes 16 can make contact with only the limited number of pins due to, for instance, the limited number of pin electronics cards of the memory tester 17. Hence, in general, at greatest 8 chips among chips mounted on the wafer 14 to be tested are concurrently tested, and then the wafer 14 is moved by the X-Y stage 12 to thereby test next 8 chips.

Japanese Unexamined Patent Publication No. 2-239641 published on Sep. 21, 1990 has suggested another apparatus for probing a semiconductor wafer. The suggested apparatus comprises a box type test head including a test circuit therein, a performance board mounted on top of the test head, a connector secured to the test head for connecting the test circuit to the performance board, a fixed card mounted on the performance board in electrical connection therewith, and a semiconductor chip to be tested which is to make contact with a fixed probe mounted on the fixed card. This apparatus is characterized by that signals for measuring semiconductor pellet performance are caused to run between the performance board and the fixed card.

The conventional testers as mentioned above have problems such as that they can test only the limited number of chips at a time and hence it takes much time to test all chips mounted on a wafer to be tested, and that they cannot carry out high frequency test because of long wiring distance between the tester and the memory tester.

Turning to a film to be used for a semiconductor wafer probing apparatus, there has been suggested a ultra-high density anisotropic conductive film by Masakazu Sugimoto et al. in Nitto Technical Report, Vol. 30, No. 1, May 1992, pp. 45–47. A conventional film including the above mentioned film has no resiliency in a film-width direction, resulting in that it is quite difficult to carry out a plurality of contacts at a quite small pitch at a time in a wide area.

SUMMARY OF THE INVENTION

In view of the problems of the prior testers, it is an object of the present invention to provide an apparatus for testing a semiconductor wafer which is capable of carrying out high frequency test for a great number of semiconductor wafers at a time in a shorter period of time with lower cost.

It is also an object of the present invention to provide an apparatus for testing a semiconductor wafer which is capable of carrying out a plurality of contacts at a quite small pitch at a time.

The present invention provides an apparatus for testing a semiconductor wafer, including (a) a substrate, (b) at least one chip mounted on an upper surface of the substrate, the chip having function as a tester, the chip being electrically connected to a contact formed on a lower surface of the substrate through an internal wiring formed in the substrate, and (c) a contact film having at least one first bump formed on an upper surface thereof and at least one second bump formed on a lower surface thereof. The first bump is electrically connected to the second bump through an internal wiring formed throughout the contact film. The contact film is to be disposed to be sandwiched between the substrate and a semiconductor wafer to be tested so that the first bump is in electrical contact with the contact of the substrate and the second bump is in electrical contact with the semiconductor wafer.

In accordance with the above mentioned apparatus, the substrate on which test chips having functions as a tester are mounted is in contact with a wafer to be tested through the contact film having bumps formed on upper and lower surfaces thereof. Thus, the apparatus makes it possible to carry out a great number of contacts at a time for a large area wafer with shorter signal path with high reliability. Thus, it is possible to carry out high frequency test with high accuracy in a short period of time with less cost.

The apparatus may further include an external tester, and a cable connected to a terminal formed on the substrate so that the cable electrically connects the chip to the external tester. Signals run between the chip and the external tester. In accordance with the apparatus additionally including the external tester and the cable, it is possible to carry out high frequency test without a high-performance and hence expensive tester. In addition, the test can be carried out in a shorter period of time with significantly lower costs.

The contact film may include a plurality of first bumps formed on an upper surface thereof and a plurality of second bumps formed on a lower surface thereof, in which case the first bumps may be preferably disposed in non-alignment with the second bumps so that one of the first and second bumps is disposed to be surrounded by the other. Even if a surface of a wafer to be tested has irregularity, the bumps can yield into the contact film to thereby absorb such irregularity. This is enabled by the non-alignment arrangement of the first and second bumps. Thus, contact on test between a wafer to be tested and the substrate is ensured even in a large area wafer, resulting in higher accuracy in test. In addition, it is possible to increase the number of chips to be tested at a time.

The contact film is preferably made of elastic material such as silicone rubber. By using elastic material of which the contact film is to be made, the contact film can compensate for irregularity in height of a surface of a wafer to be tested.

It is preferably to constitute the substrate of a multi-layered substrate having internal wirings formed therein. This embodiment makes it possible to vary pitches between contacts formed on upper and lower surfaces of the substrate.

The present invention further provides an apparatus for testing a semiconductor wafer, including (a) a substrate, (b) at least one chip mounted on an upper surface of the substrate, the chip having function as a tester, the chip being electrically connected to a contact formed on a lower surface of the substrate through an internal wiring formed in the substrate, and (c) a contact film having at least one first bump formed on an upper surface thereof and at least one second bump formed on a lower surface thereof. The first bump is electrically connected to the second bump through an internal wiring formed throughout the contact film, and at least a part of the internal wiring and the first and second bumps is made of shape memory alloy. The contact film is to be disposed to be sandwiched between the substrate and a semiconductor wafer to be tested so that the first bump is in electrical contact with the contact of the substrate and the second bump is in electrical contact with the semiconductor wafer.

It is preferable that the internal wiring and the first and second bumps are plated with metal. It is preferable to compose the bumps of bidirectional shape memory alloy.

Since the shape memory alloy has the characteristic of recovering to an original shape, the use of shape memory alloy provides elastic function in a direction of contact between the substrate and a wafer to be tested. Thus, the shape memory alloy absorbs dispersion in contact gap between the substrate and a wafer to be tested, and thus provides stable contact between them for a large area wafer having narrow pitch between adjacent pins.

The present invention still further provides a contact film to be used for a semiconductor wafer tester. The contact film is made of electrically insulating material and includes at least one first bump formed on an upper surface thereof and at least one second bump formed on a lower surface thereof. The first bump is electrically connected to the second bump through an internal wiring formed throughout a thickness of the contact film. At least a part of the internal wiring and the first and second bumps is made of shape memory alloy. The contact film is to be disposed to be sandwiched between a substrate and a semiconductor wafer to be tested so that the first bump is in electrical contact with the substrate and the second bump is in electrical contact with the semiconductor wafer.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Preferred embodiments in accordance with the present invention will be explained hereinbelow with reference to drawings.

Figure 2:
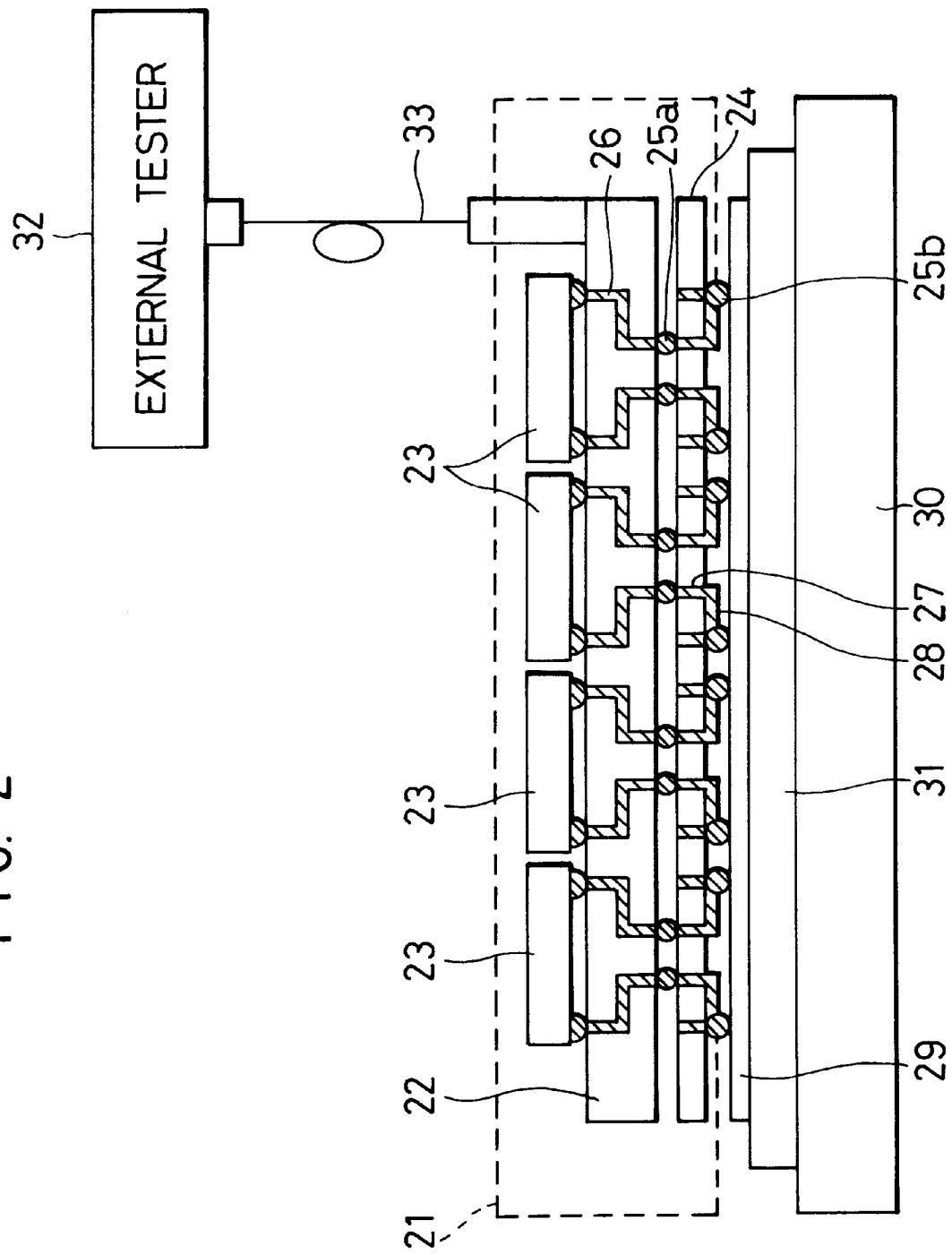
FIG. 2 illustrates an apparatus for testing a semiconductor wafer to be fabricated in accordance with the first embodiment of the present invention.

With reference to FIG. 2, an apparatus 21 for testing a semiconductor wafer includes a multilayered substrate 22, a plurality of LSI test chips 23 mounted on an upper surface of the substrate 22 and functioning as a semiconductor wafer tester, and a contact film 24 having a first set of bumps 25a formed on an upper surface of the contact film 24 and a second set of bumps 25b formed on a lower surface of the contact film 24. The LSI test chips 23 are electrically connected to contacts (not illustrated) formed on a lower surface of the substrate 22 through internal wirings 26 formed in the substrate 22. Each of the first set of bumps 25a is electrically connected to each of the second set of bumps 25b through both internal wirings 27 formed throughout the contact film 24 and external wirings 28 formed on the lower surface of the contact film 24. For the sake of clarity, the apparatus 21 is shown surrounded with a broken line.

As mentioned later, the contact film 24 is to be disposed sandwiched between the multi-layered substrate 22 and a semiconductor wafer 29 to be tested so that the first set of bumps are in electrical contact with the contact of the substrate 22 and the second set of bumps are in electrical contact with the semiconductor wafer.

The semiconductor wafer 29 to be tested is fixed on an X-Y stage 30 by means of a vacuum chuck 31. It is possible to select an area to be tested in the wafer 29 by moving the X-Y stage 30 in X-axis and/or Y-axis direction.

Figure 1:
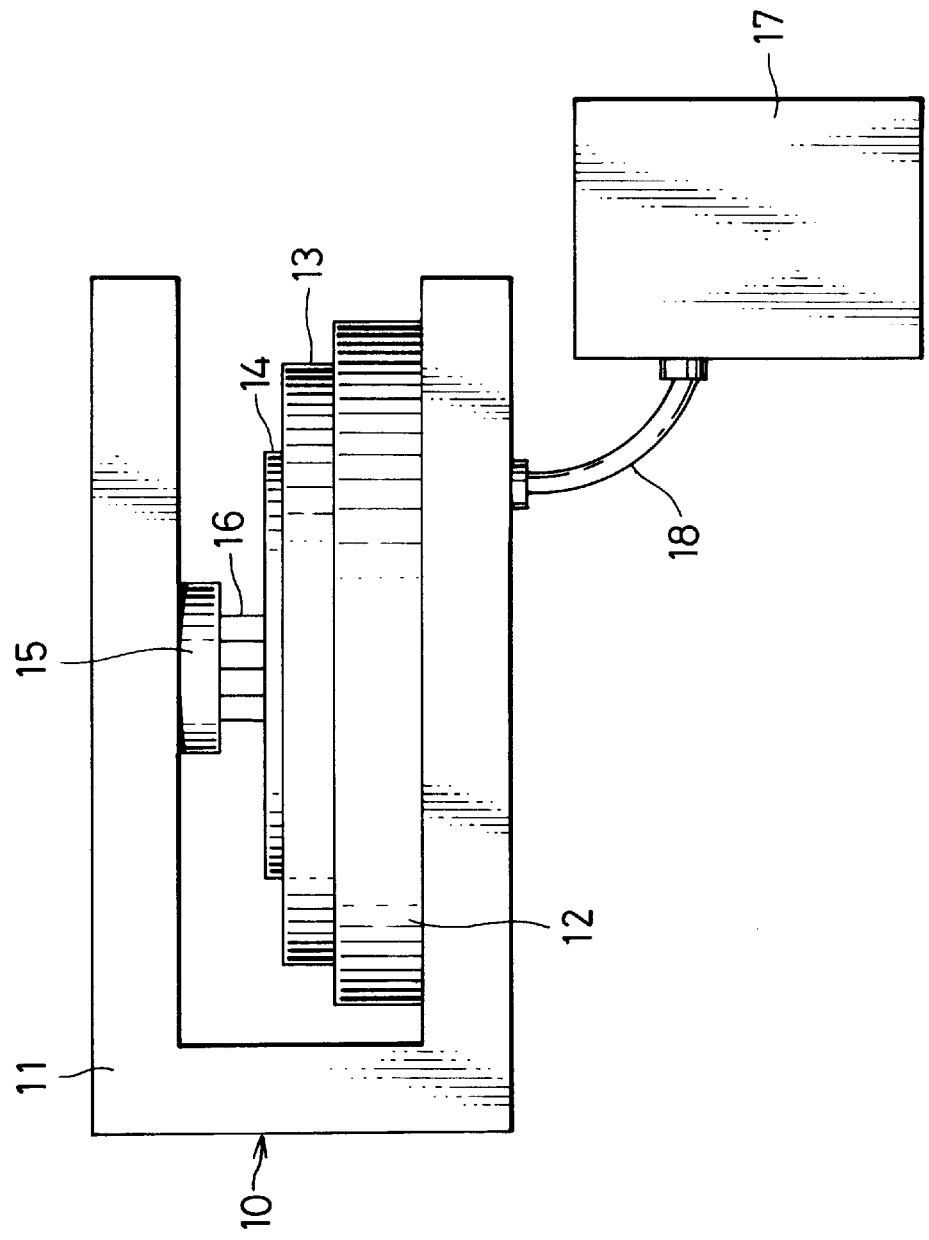
FIG. 1 is a schematic view illustrating a conventional apparatus for testing a semiconductor wafer.

The apparatus 21 is in electrical connection with an external tester 32 through a cable 33. The external tester 32 provides electric power to the apparatus 21, and transmits signals to and receives signals from the apparatus 21 through I/O pins (not illustrated) thereof. The LSI test chips 23 have various functions of an LSI tester such as a pin electronics card including a driver and a comparator, a pattern memory, a formatter circuit, a dock generating circuit, and a DC or AC measuring circuit. In this embodiment, as the external tester 32 is used a tester having relatively simple structure and the smaller number of pins in place of the memory tester 17 illustrated in FIG. 1 which is an LSI tester having high performance and a multitude of high speed pins.

The external tester 32 transmits test data such as test patterns, waveform formats and timing data to the LSI test chips 23, and concurrently the LSI test chips 23 apply signals to a plurality of semiconductor chips mounted on the wafer 29 to be tested through both the internal wirings 26 of the substrate 22 and the bumps 25a and 25b. Response output signals transmitted from the semiconductor chips mounted on the wafer 29 are received by the LSI test chips 23. For instance, the thus received response signals are compared with a expected value in the LSI test chips 23, and then test results such as pass or fail and fail memory data are transmitted to the external tester 32.

Figure 3:
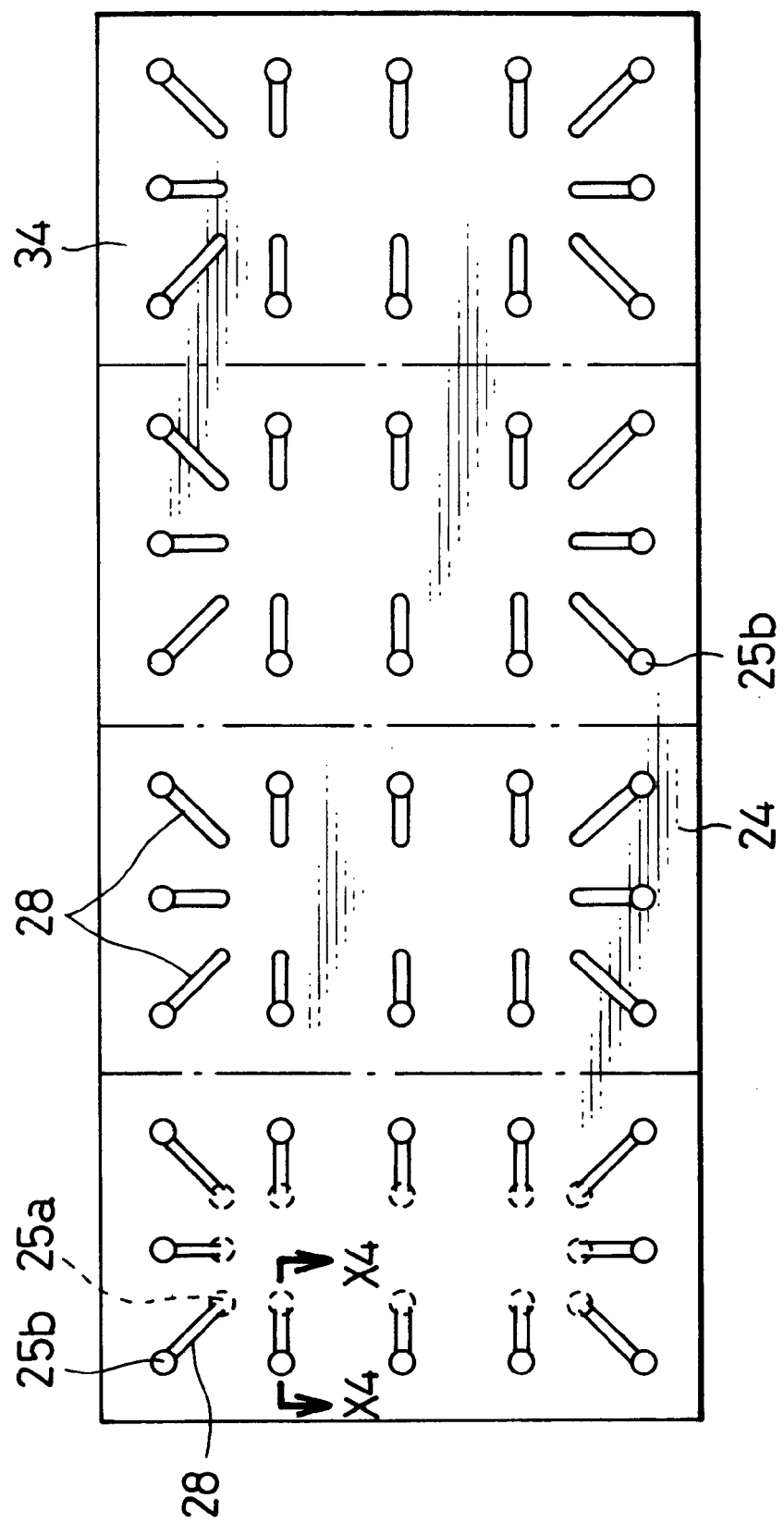
FIG. 3 is a plan view illustrating a contact film to be used for the apparatus.

FIG. 3 is a plan view of the contact film 24 as viewed from the wafer 29 to be tested. As illustrated, the second bumps 25b formed on a lower surface of the contact film 24 are electrically connected to the first bumps 25a formed on an upper surface of the contact film 24 through the external wirings 28 and the internal wirings 27 (not illustrated in FIG. 3. See FIG. 2). The contact film 24 is divided into four chip areas 34 in each of which the first and second bumps 25a and 25b are arranged in rectangular fashion.

Figure 4:
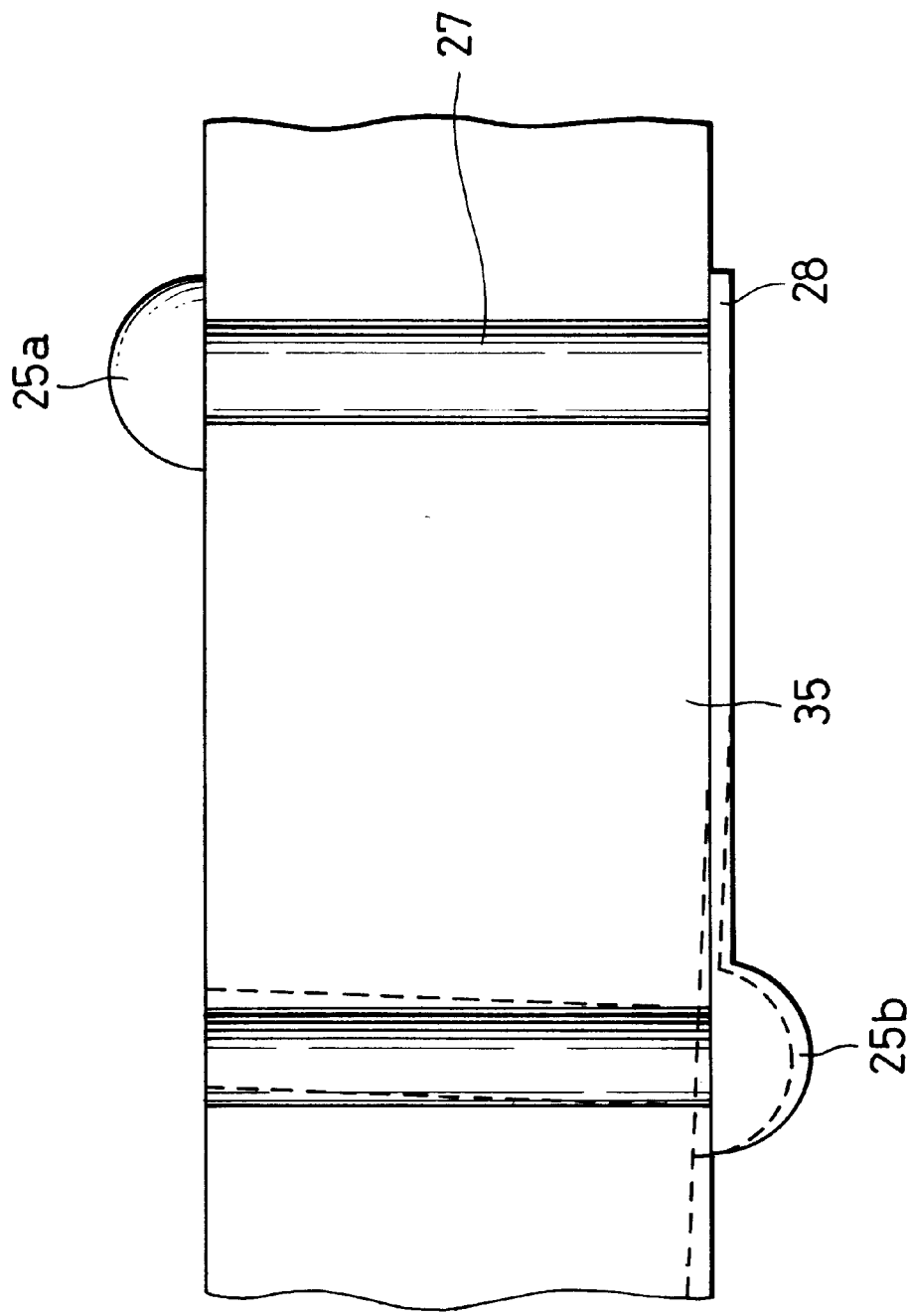
FIG. 4 is a cross-sectional view taken along the line X4—X4 in FIG. 3.

In this embodiment, the contact film 24 is made of silicone rubber having much elasticity. In addition to the elasticity of the contact film 24, the first and second bumps 25a and 25b are disposed in non-alignment with each other. Thus, a position of the bump can be readily varied by elastic deformation of the contact film. Thus, even if the wafer 29 has an irregularity on an upper surface thereof, such irregularity can be absorbed as a result of elastic deformation of the contact film 24 as illustrated in FIG. 4 with a broken line.

Figure 5:
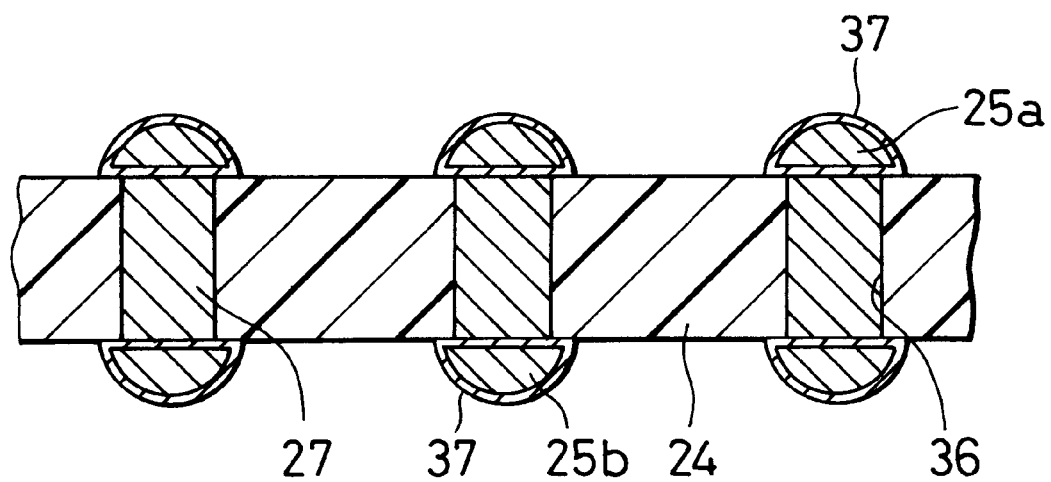
FIG. 5 is a cross-sectional view of another contact film.

FIG. 5 illustrates another example of the contact film 24. The contact film 24 in this example is made of electrically insulating polyimide, and is formed in a thickness-wise direction with a plurality of extremely small through holes 36 arranged in a grid fashion. The through holes 36 are filled with nickel to thereby form the internal wirings 27. At the opposite ends of the internal wirings 27 are formed the first and second bumps 25a and 25b in electrical connection with the internal wirings 27 on upper and lower surfaces of the polyimide contact film 24, respectively. In this example, the first and second bumps 25a and 25b are made of shape memory alloy such as Ti—Ni alloy. The first and second bumps 25a and 25b are plated with gold 37 in order to minimize electrical resistance thereof, and are connected to the internal wirings 27 by compressive fitting. As an alternative to gold, the bumps 25a and 25b may be plated with another metal to decrease electrical resistance of the bumps.

Figure 6A:
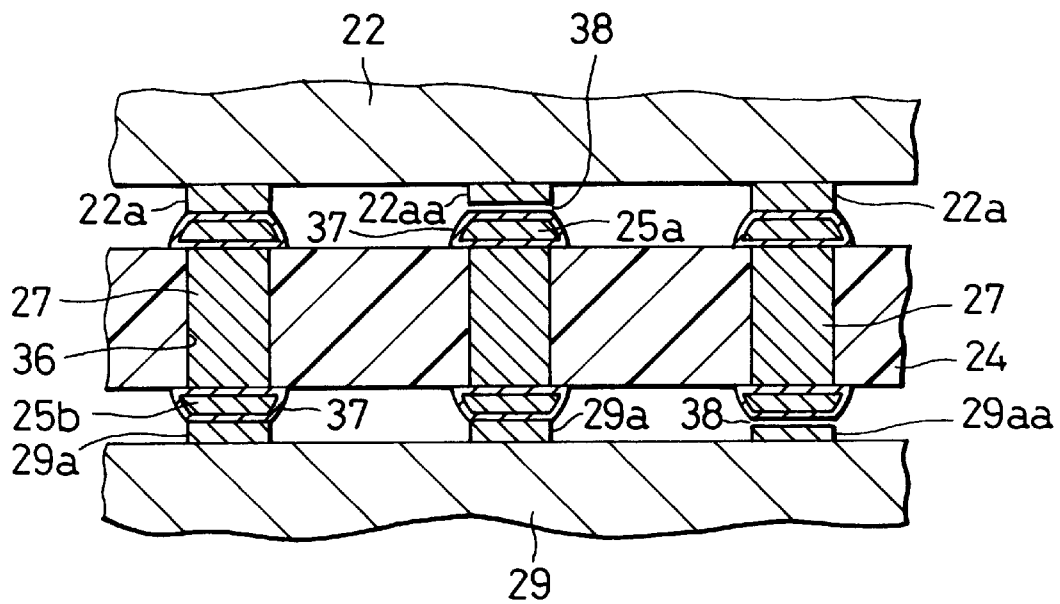
FIG. 6A is a cross-sectional view of the contact film illustrated in FIG. 5 while the contact film is not in contact with a substrate and/or a wafer to be tested.
Figure 6B:
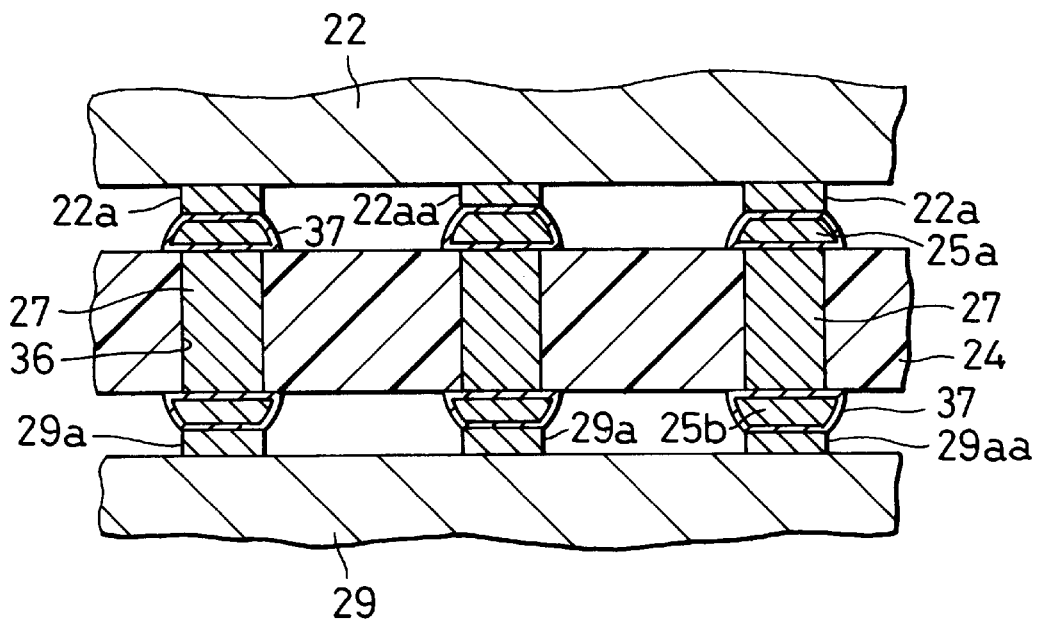
FIG. 6B is a cross-sectional view of the contact film illustrated in FIG. 5 while the contact film is in contact with a substrate and a wafer to be tested.

The contact film 24 in this example operates as follows. As illustrated in FIG. 6A, the contact film 24 is disposed between the multi-layered substrate 22 and the wafer 29 to be tested. In this example, each of the substrate 22 and the wafer 29 is formed with pads 22a and 29a, respectively, with which the first and second bumps 25a and 25b are to make contact.

In initial stage illustrated in FIG. 6A, the first and second bumps 25a and 25b made of shape memory alloy have collapsed summits. In the initial stage illustrated in FIG. 6A, since the pads 22a and 29a are not uniform in height, namely the pads 22a and 29a have different height from one another, some pads 22aa and 29aa do not make contact with the first and second bumps 25a and 25b to thereby form a gap 38 therebetween. It is assumed that the gaps 38 are in a range which can be compensated by the deformation of the first and second bumps 25a and 25b. Thus, the pads 22aa and 29aa prevent the substrate 22 from making electrical connection with the wafer 29 to be tested.

Then, the contact film 24 is heated so that shape memory alloy of which the bumps 25a and 25b are made reaches the phase-transformation point, and hence is changed in phase from martensite to austenite. By being heated, the shape memory alloy recovers to original hemispherical shape from the collapsed shape. Thus, the gaps 38 are eliminated, and thereby all the pads 22a and 29a can make contact with the first and second bumps 25a and 25b, respectively. As a result, the substrate 22 is full connection with the wafer 29 to be tested through the contact film 24.

The bumps 25a and 25b may be made of bidirectional shape memory alloy. The use of bidirectional shape memory alloy makes it possible to select a shape of the bumps 25a and 25b among two shapes: the bumps 25a and 25b are hemispherical in one case; and the bumps 25a and 25b have collapsed ends in the other. Namely, it is possible to cause the bumps 25a and 25b to have one of the above mentioned two shapes by controlling the temperature of the bumps 25a and 25b.

Figure 7:
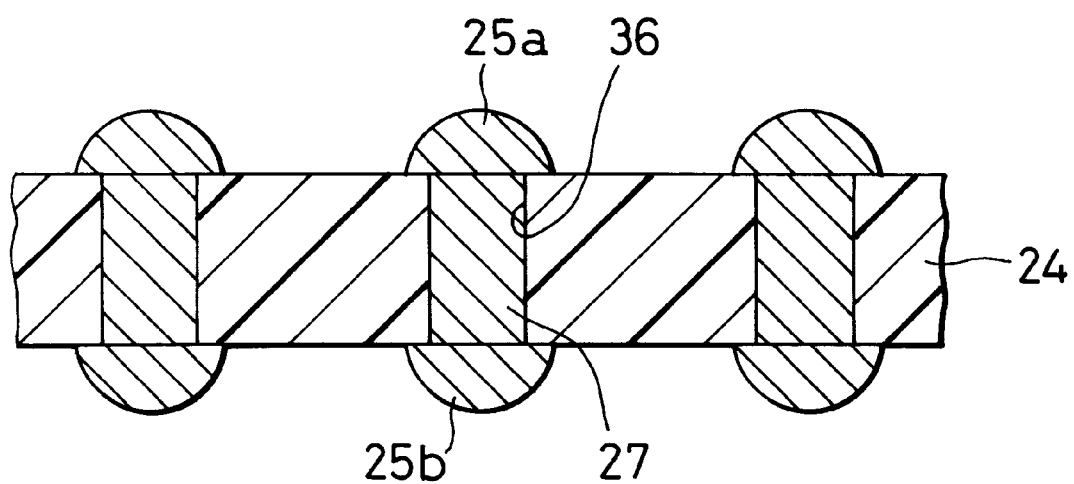
FIG. 7 is a cross-sectional view of still another contact film.

FIG. 7 is a cross-sectional view illustrating a still another example of the contact film 24. In this example, all of the bumps 25a and 25b and the internal wirings 27 are made of shape memory alloy. In accordance with this example, similarly to the example illustrated in FIG. 5, it is possible to make electrical connection between the substrate 22 and the wafer 29 by heating both the bumps 25a, 25b and the internal wirings 27 to thereby cause the bumps 25a and 25b having collapsed ends to recover to their original hemispherical shape.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

What is claimed is:

1. An apparatus for testing a semiconductor wafer, comprising:

a substrate;

at least one chip mounted on an upper surface of said substrate, said chip functioning as a tester, said chip being electrically connected to a contact formed on a lower surface of said substrate through an internal wiring formed in said substrate;

an elastic contact film having at least one first bump formed on an upper surface thereof and at least one second bump formed on a lower surface thereof, said first bump being electrically connected to said second bump through an internal wiring formed throughout said contact film, said contact film disposed between said substrate and a semiconductor wafer to be tested so that said first bump is in electrical contact with said contact of said substrate and said second bump is in electrical contact with said semiconductor wafer to be tested;

wherein said at least one first bump formed on an upper surface of said elastic contact film and said at least one second bump formed on a lower surface of said resilient contact film are disposed in non-alignment with respect to one another.

2. The apparatus as set forth in claim 1, wherein said resilient contact film includes a plurality of first bumps formed on an upper surface thereof and a plurality of second bumps formed on a lower surface thereof, said plurality of first bumps are disposed in non-alignment with said plurality of second bumps, wherein said elastic contact film is divided into at least one chip area, and wherein one of said plurality of first bumps and said plurality of second bumps is disposed to occupy an interior portion of said at least one chip area relative to another of said plurality of first bumps and said plurality of second bumps.

3. The apparatus as set forth in claim 1, wherein said substrate is constituted of a multi-layered substrate having internal wirings formed therein, said internal wirings having a function of varying pitches between contacts formed on upper and lower surfaces of said substrate.

4. The apparatus as set forth in claim 1 further comprising:

an external tester; and a cable connected to a terminal formed on said substrate so that said cable electrically connects said chip to said external tester, said chip transmitting signals to and receiving signals from said external tester.

5. The apparatus as set forth in claim 1, wherein said elastic material is silicone rubber.

6. An apparatus for testing a semiconductor wafer, comprising:

a substrate;

at least one chip connected to a first surface of said substrate, said chip being electrically connected to a contact formed on another surface of said substrate;

an elastic contact film having at least one first bump formed on a first surface thereof and at least one second bump formed a second surface thereof, wherein said first bump and said second bump are in electrical contact with each other and wherein one of said first bump or said second bump is in contact with said contact of said substrate; and wherein said first bump and said second bump are not aligned along a normal line to each of said first surface and said second surface of said elastic contact film.

7. An apparatus for testing a semiconductor wafer as claimed in claim 6, wherein said chip is electrically connected to said contact through an internal electrically conductive path formed in said substrate.

8. An apparatus for testing a semiconductor wafer as claimed in claim 7, wherein said first bump and said second bump are in electrical contact with each other through an internal electrically conductive path formed in said contact film.

9. An apparatus for testing a semiconductor wafer as claimed in claim 8, wherein one of said first bump and said second bump not in electrical contact with said contact of said substrate is in electrical contact with a semiconductor wafer.

* * * * *

UNITED STATES PATENT AND TRADEMARK OFFICE
CERTIFICATE OF CORRECTION

PATENT NO.: 6,133,744
DATED: October 17, 2000
INVENTOR(S): Masayuki YOJIMA, Tohru TSUJIDE, Kazuo Nakaizumi It is certified that error(s) appears in the above-identified patent and that said Letters Patent is hereby corrected as shown below:

Column 4, line 48, delete "dock" insert --clock--.

Column 5, line 13, delete "." after "film", insert --24.--;

line 16, delete "line." insert --line, or by elastic deformation of the bump 25b itself.--.

Column 6, line 34, delete "elastic", resilient and flexible--;

line 46, delete "elastic" insert --resilient and flexible--;

line 55, delete "elastic" insert --resilient--.

Column 7, line 13, delete "elastic" insert --resilient--.

Column 8, line 3, delete "elastic" insert --resilient--.

Signed and Sealed this

Twenty-second Day of May, 2001

Attest:

NICHOLAS P. GODICI

*Attesting Officer*       *Acting Director of the United States Patent and Trademark Office*